United States Patent
Tench et al.

[11] Patent Number: 5,711,804
[45] Date of Patent: Jan. 27, 1998

[54] METHOD OF FORMING A METALLIC OXIDE COATING WITH A DESIRED CRYSTALLOGRAPHIC ORIENTATION

[75] Inventors: D. Morgan Tench, Ventura; Leslie F. Warren, Jr., Camarillo; Young J. Chung, Calabasas, all of Calif.

[73] Assignee: Rockwell International Corporation, Costa Mesa, Calif.

[21] Appl. No.: 642,381

[22] Filed: May 3, 1996

[51] Int. Cl.$^6$ ........................................................ C30B 1/10
[52] U.S. Cl. ................................ 117/4; 117/9; 117/944
[58] Field of Search ................................ 117/4, 9, 944; 427/98, 305, 437

[56] References Cited

U.S. PATENT DOCUMENTS 5,206,102   4/1993   Tench .......................................... 430/49

FOREIGN PATENT DOCUMENTS 7330326   12/1995   Japan .

OTHER PUBLICATIONS

S.K. Verma and H. Wilman, "The Structure and Crystal Growth of Nickel Electrodeposits from a Sulfamate Bath on Polished Polycrystalline Copper, in Relation to Thickness, Rate of Deposition, Temperature and Stirring", *J. Phys. D: Appl. Phys.*, vol. 4, pp. 2051–2065 (1971).

A.K.N. Reddy and S.R. Rajagopalan, "Preferred Orientations in Nickel Electro–Deposits I–III," *J. Electroanal. Chem.*, vol. 6, pp. 141–163 (1963).

Beach et al. "Thickness dependent electric properties of sol-gel preparing level lanthan titanate films", Integr. Ferroelectr (1995), vol. 7(1–4), pp. 161–171 abs only.

*Primary Examiner*—Robert Kunemund

[57] ABSTRACT

Oxide coatings are formed with a desired crystallographic texture over a large surface area. A metallic substrate is electrodeposited or vacuum deposited with a preferred crystallographic orientation, and a sol-gel/thermal process is used to form a "pseudo-epitaxial" oxide coating having crystallites that are influenced by the crystallographic orientation of the substrate. In one embodiment, p-type nickel oxide coatings with desirable electronic properties are produced by sol-gel/thermal processing on nickel substrates electrodeposited from a sulfamate nickel bath at a relatively high current density and low temperature. The electrodeposited nickel substrate has a strong Ni{100} preferred orientation. Epitaxial effects during sol-gel/thermal formation of NiO on the electrodeposited substrate enhance the extent to which the NiO{100} and NiO{111} crystal facets are aligned parallel to the coating surface, and minimize the NiO{110} orientation. This texture modification significantly improves the photoresponse of the nickel oxide coating. The method is anticipated to be useful in other metal oxide/metal substrate systems for the production of catalysts, cathodes for lithium ion and nickel-cadmium batteries, photoelectrochemical printed circuits, high-temperature electronic devices, flat panel displays, photoelectrochemical solar cells, and sensors. An advantage of the invention is that electrodeposition, vacuum deposition, and sol-gel/thermal processes are suitable for coating large surface areas.

7 Claims, 1 Drawing Sheet

METHOD OF FORMING A METALLIC OXIDE COATING WITH A DESIRED CRYSTALLOGRAPHIC ORIENTATION

TECHNICAL FIELD

The present invention relates to oxide coatings and, in particular, to a sol-gel/thermal process of forming an oxide coating with a desired crystallographic orientation on a substrate having a preferred crystallographic texture.

BACKGROUND OF THE INVENTION

Metal oxide coatings are useful in a wide variety of applications. In many applications, the spatial orientation of oxide crystallites has a significant effect on the performance of the coating. For example, polycrystalline semiconductor materials usually have poor electronic properties because grain boundaries (i.e., the interfaces between crystallites) act as barriers or traps for charge carriers. Grain boundaries tend to decrease charge carrier mobility and increase recombination of photogenerated electron-hole pairs. However, polycrystalline materials with crystallites aligned in a preferred orientation, so that grain boundaries intersect at low angles and generally run parallel to the desired direction of charge transport, can exhibit electronic performance approaching that of the optimum achieved in single crystal materials.

Ion mobility may also be affected by the crystallographic texture of the oxide material. Electrochemical insertion or removal of ions is likely to be faster and more efficient for textured oxide materials because the ion paths are shorter and less tortuous. It is believed that crystallographic texture can be used to enhance the mobility of $Li^+$ ions in nickel oxide materials formed by a sol-gel/thermal process, for example, and thereby improve the performance of electrochromic devices and lithium-ion batteries.

Preferred crystallographic orientation can also be used to adjust the relative areas of crystal facets exposed at an interface so as to maximize the rate of desired chemical, electrochemical, or photoelectrochemical reactions and to minimize the rates of undesirable side reactions. Such reaction specificity is particularly important for catalytic synthesis and photoelectrochemical deposition processes. A practical example is mentioned in U.S. Pat. No. 5,206,102 issued to D. M. Tench on Apr. 27, 1993, for a "Photoelectrochemical Imaging System," the teachings of which are hereby incorporated by reference.

In the system described in U.S. Pat. No. 5,206,102, photoelectrochemical deposition of copper on a p-type nickel oxide coating is used to produce an erasable image on a printing press cylinder directly from digital information. In a newspaper printing application, however, such a system requires good light quantum efficiency for copper deposition over a large area, at least half a square meter. It has been determined that crystal texture in the NiO coating influences the quantum efficiency for this process through enhanced charge transport in the semiconductor and minimization of hydrogen evolution as a side reaction at the semiconductorelectrolyte interface. Although epitaxial growth on single crystal substrates is widely used to prepare small area semiconductor layers for electronic devices, there is a need for a practical method of attaining a preferred crystallographic orientation in oxide coatings over large areas, such as in printing press and solar cell applications, for example.

SUMMARY OF THE INVENTION

The present invention comprises a method of producing oxide coatings with desired crystallographic textures over large surface areas. In preparation for such an oxide coating, a metallic underlayer or substrate is produced by electrodeposition or other appropriate methods (such as vacuum deposition, for example) to form metal crystallites having a desired or preferential crystallographic orientation. A "pseudo-epitaxial" oxide coating is then formed using a sol-gel/thermal process in which the orientations of the oxide crystallites are influenced by "epitaxial effects" of the substrate. In the past, epitaxial effects on crystallographic orientation were assumed to be of little importance in sol-gel/thermal processing. However, it has been discovered that the "epitaxial effect" can be used either to enhance or to minimize specific crystallographic orientations in a sol-gel/thermal oxide coating. The terms "pseudo-epitaxial" and "epitaxial effects" denote the tendency of the sol-gel/thermal oxide layer to be influenced by the orientation of the substrate. The term "epitaxial" is used loosely in the context of sol-gel/thermal processing because the orientation of the oxide coating may also contain orientations that are present only in low concentrations (or totally absent) in the substrate. This result is most likely when the metal substrate and the oxide coating have different crystallographic space groups. The term "sol-gel/thermal oxide," as used herein, includes thermal oxides alone as well as mixed sol-gel and thermal oxides formed during sol-gel processing. The oxide coating can be formed by thermal oxidation alone, but sol-gel methods allow impurity doping of the oxide coating and generally produce better results. Because substrate thermal oxidation occurs during sol-gel processing, a mixed sol-gel/thermal oxide is inevitably formed.

In the system of U.S. Pat. No. 5,206,102 cited above, improved NiO photoresponse is necessary for developing a practical photoelectrochemical on-press imaging process. In one embodiment of the present invention, p-NiO semiconductor coatings with good electronic properties have been produced by a sol-gel/thermal coating on an electrodeposited nickel substrate. The nickel substrate is deposited at a relatively high current density from a sulfamate nickel plating bath, which yields deposits having a strong Ni{100} preferred orientation (i.e., the Ni{100} planes tend to align with the substrate surface), as further described in A. K. N. Reddy and S. R. Rajagopalan, "Preferred Orientations in Nickel Electro-Deposits I-III," *J. Electroanal. Chem.*, Vol. 6, pp. 141–163 (1963), and S. K. Verma and H. Wilman, "The Structure and Crystal Growth of Nickel Electrodeposits from a Sulfamate Bath on Polished Polycrystalline Copper, in Relation to Thickness, Rate of Deposition, Temperature and Stirring," *J. Phys. D: Appl. Phys.*, Vol. 4, pp. 2051–2065 (1971). For such electrodeposited substrates, epitaxial effects during sol-gel/thermal oxide processing enhance the NiO{100} and NiO{111} orientations and minimize the aligned Ni{110} facets. With a lithium-doped oxide underlayer to provide an ohmic contact with the nickel substrate, the preferred crystallographic texture in sol-gel/thermal NiO coatings significantly reduces the laser illumination time required to photoelectrochemically initiate (or seed) growth of copper deposits from copper pyrophosphate baths.

In addition to improving photoelectrochemical imaging processes, the method of the present invention is anticipated to be useful in the production of catalysts, cathodes for lithium ion and nickel-cadmium batteries, photoelectrochemical printed circuits, high-temperature electronic devices, flat panel displays, photoelectrochemical solar cells, and sensors. The combined processes of metal substrate electro- or vacuum deposition and epitaxially influenced sol-gel/thermal oxide coating are also believed to be applicable to other metallic oxide/substrate systems in addition to the NiO/Ni system, including CoO/Co, TiO$_2$/Ti, V$_2$O$_3$/V, Cr$_2$O$_3$/Cr, MnO$_2$/Mn, and mixed metal oxides, for example.

A principal object of the invention is the production of oxide coatings having a desired crystallographic texture over a large surface area. A feature of the invention is the combination of an electrodeposition or vacuum deposition process to produce a crystallographically textured substrate and a sol-gel/thermal coating process that uses epitaxial effects to produce an oxide coating having a desired crystallographic texture. An advantage of the invention is that electrodeposition, vacuum deposition, and sol-gel/thermal processes are all suitable for coating large surface areas.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

Figure 1:
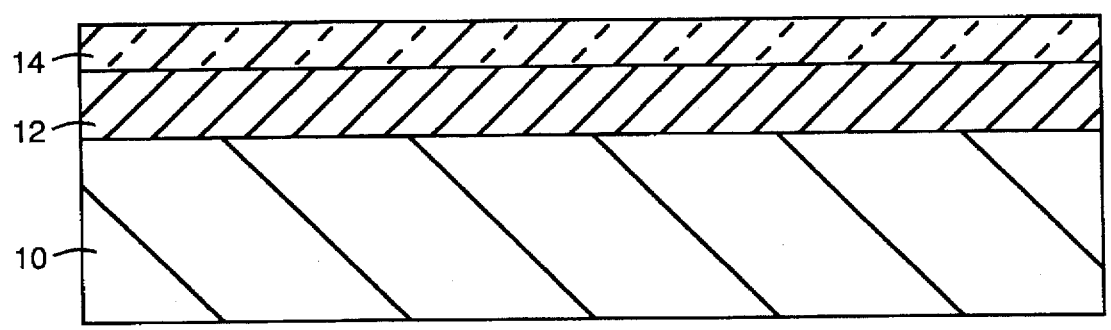
FIG. 1 is a schematic cross section illustrating a support structure or base, a substrate having a preferred crystallographic texture deposited on the support structure, and a pseudo-epitaxial sol-gel/thermal oxide coating that is influenced by epitaxial effects of the textured substrate to acquire a desired crystallographic orientation.

The present invention comprises a method of producing an oxide coating with a desired crystallographic orientation over a large surface area, as illustrated schematically in the cross section of FIG. 1. In preparation for the oxide coating, a metallic underlayer or substrate 12 is produced on a supporting structure or base 10 using electrodeposition or other appropriate methods (such as vacuum deposition, for example) to deposit metal crystallites having a desired or preferential crystallographic orientation. A "pseudo-epitaxial" oxide coating 14 is then formed using a sol-gel/thermal process in which "epitaxial effects" influence the orientations of the oxide crystallites. As a result, oxide coating 14 acquires a desirable crystallite alignment. In the context of sol-gel/thermal processing, the term "epitaxial effects" denotes the tendency of the sol-gel/thermal oxide coating to be influenced by the crystallographic orientation of the substrate. Therefore, "epitaxial" is used loosely in this context because oxide coating 14 may contain crystallographic orientations that are absent or present only in low concentrations in substrate 12. However, the "epitaxial effect" can be used to either enhance or minimize specific crystallographic orientations in sol-gel/thermal oxide coating 14 for improved electronic properties.

In the prior art, epitaxial effects on crystallographic texture were generally assumed to be of little importance in sol-gel/thermal oxide processing. However, the present process of forming pseudo-epitaxial sol-gel/thermal coatings on electro- or vacuum deposited substrates is believed to be applicable to many metallic oxide/metal substrate systems, including NiO/Ni, CoO/Co, TiO$_2$/Ti, V$_2$O$_3$/V, Cr$_2$O$_3$/Cr, MnO$_2$/Mn, and mixed metal oxides, for example. In a preferred embodiment of the present invention, an electrodeposited nickel substrate 12 is formed to support a pseudo-epitaxial sol-gel/thermal nickel oxide coating 14 having a preferred crystallographic orientation for enhanced photoresponse characteristics.

In the preferred embodiment, which is described as an example and not a limitation of the present invention, p-NiO semiconductor coatings 14 with good electronic properties are produced by a sol-gel/thermal process on an electrodeposited nickel substrate 12. The nickel substrate 12 is deposited at a relatively high current density and low temperature from a sulfamate nickel bath, which yields deposits having a strong Ni{100} preferred orientation (i.e., the Ni{100} planes tend to align with the substrate surface). This process is described by S. K. Verma and H. Wilman in "The Structure and Crystal Growth of Nickel Electrodeposits from a Sulfamate Bath on Polished Polycrystalline Copper", *J. Phys. D: Appl. Phys.*, Vol. 4, pp. 2051-2065 (1971). The electrodeposited material generally exhibits a preferential crystallographic orientation that depends on electrodeposition current density (or voltage), plating bath composition (including complexing agents and additives), pH, and temperature, as described by A. K. N. Reddy and S. R. Rajagopalan in "Preferred Orientations in Nickel Electro-Deposits I-III," *J. Electroanal. Chem.*, Vol. 6, pp. 141-163 (1963).

The plating bath used to prepare electrodeposited nickel substrates had a pH of 4.0 and contained 512.6 g/L anhydrous nickel sulfamate, 37.5 g/L boric acid, 3.0 g/L nickel chloride, and 0.15 g/L sulfamate nickel antipit (SNAP). An Inconel alloy mandrel was final polished with submicron alumina to a mirror finish, cleaned successively in acetone, isopropanol, and water, and blown dry with nitrogen gas. A polyvinylchloride (PVC) plastic flow cell employing a microporous glass separator between the anolyte and catholyte compartments was used for electrodeposition of the nickel substrate. A rectangular o-ring defined the specimen area (4.4×16.5 cm) and electrolyte was pumped rapidly along the mandrel length through a 2.8 mm high slot between the cathode mandrel and the glass separator sheet. Electrolyte was circulated between the flow cell and a reservoir maintained at constant temperature by means of a heated water bath. The separated anode comprised platinized titanium. Nickel substrates were plated, to a thickness of 0.25 mm, at 100 mA/cm$^2$ and 50° C. to obtain a high degree of Ni{100} texture, and at 50 mA/cm$^2$ and 60° C. to obtain a high degree of Ni{110} texture. Before use, the substrates were removed from the mandrel and degreased in acetone just prior to application of the sol-gel/thermal NiO coating.

The sol-gel/thermal process used to prepare the NiO coating 14 included hydrolysis of Ni(II) acetate dissolved in a mixture of 2-methoxyethanol and methanol. The resulting "sol" was then applied to the electrodeposited nickel substrate 12 by standard techniques (such as dip coating, spin coating, spraying, or meniscus coating, for example). Heat was applied to effect conversion to NiO (and to drive off water and excess solvent). Lithium doping, effected by incorporation of lithium acetate in the sol, was used to improve the back ohmic contact between the NiO coating 14 and the nickel substrate 12. The hydrolysis and condensation steps of the sol-gel/thermal process can be summarized as follows:

$$Ni(CH_3CO_2)_2 + 2H_2O \rightarrow Ni(OH)_2 + 2CH_3CO_2H$$

$$nNi(OH)_2 \rightarrow (NiO)_n + nH_2O$$

The sol was prepared by refluxing (for 6 minutes) a mixture of 1.0 g Ni acetate tetrahydrate and 2.5 g 2-methoxyethanol and diluting with 3.6 ml of methanol. To produce Li-doped underlayers, 22 mg of Li acetate dihydrate was dissolved in the methanol used for dilution of the sol. Nickel foil specimens (2.5×2.5 cm) were dip or spin coated with the sol and heated at 3° C./min. to 650° C. in air repeatedly to build up the NiO layer thickness. Each specimen had two underlayers doped with 5% lithium and five undoped overlayers. The coating comprised a mixture of sol-gel/thermal and thermal oxides and had a total thickness of about 1 μm.

Epitaxial effects during sol-gel/thermal formation of NiO on the electrodeposited substrate 12 induced NiO{100} and NiO{111} texture into the coating 14. With a lithium-doped underlayer to provide an ohmic contact with the nickel substrate 12, the enhanced NiO{100}/NiO{111} texture (and reduced NiO{110} texture) in the sol-gel/thermal coating 14 significantly improved the photoresponse of the coating (as measured photoelectrochemically). Additional improvements in photoresponse can be provided by various modifications of the sol-gel/thermal processing parameters.

the electrodeposited nickel substrates which comprised significantly fewer crystallites having the NiO{110} orientation. In fact, for the data in Table 1, there is a good correlation between a decrease in the NiO{110} crystallographic orientation and a decrease in the copper seed time. Since other factors (e.g., the NiO charge carrier concentration) are also important, the copper seed time for coatings prepared under different conditions does not always correlate exactly with the coating crystallographic texture. Nonetheless, short seed times were never observed for coatings exhibiting a relative NiO{110} X-ray intensity of greater than 0.25.

TABLE 1

| Substrate Type | Relative X-Ray Intensities | | | | | | | | | Seed Time (μs) |
|---|---|---|---|---|---|---|---|---|---|---|
| | Initial Ni Substrate | | | Coated Ni Substrate | | | NiO Coating | | | |
| | {110} | {100} | {111} | {110} | {100} | {111} | {110} | {100} | {111} | |
| Ni-200 | 0.29 | 0.64 | 0.07 | 0.33 | 0.62 | 0.05 | 0.30 | 0.26 | 0.44 | 9000 |
| ED Ni | 0.84 | 0.08 | 0.08 | 0.73 | 0.22 | 0.05 | 0.26 | 0.48 | 0.26 | 300 |
| ED Ni | 0.01 | 0.98 | 0.01 | 0.16 | 0.22 | 0.62 | 0.24 | 0.32 | 0.44 | 20 |

For example, further annealing at 650° C. for 3 hours to produce additional thermal oxidation of the substrate was found to reduce copper seed time, such as described in the photoelectrochemical on-press imaging process of U.S. Pat. No. 5,206,102.

Photoelectrochemical measurements were performed in a polypropylene cell, which formed an o-ring seal to the foil specimen (3.1 cm$^2$ exposed area) and had a high-purity (99.99%) copper ring around the periphery that served as both reference and counter electrode. The potential of this Cu/Cu pyrophosphate reference electrode was approximately the same as that for the standard hydrogen electrode (within ±10 mV). The specimen was illuminated with 325 nm light through a quartz window and about 2 mm of copper pyrophosphate plating solution using a 30 mW single-mode helium-cadmium laser focused to a dot size of about 25 μm diameter. The illumination intensity at the specimen surface, measured by replacing the foil specimen with a quartz window, was 9 mW. Imaging was performed in an electrolyte containing 52.5 g/L copper pyrophosphate and 201.1 g/L potassium pyrophosphate (adjusted to pH 8.0 with phosphoric acid).

Copper seed times were determined by illuminating a series of spots on the NiO coating surface under a reverse bias of −0.50 V vs. Cu/Cu pyrophosphate for various times, and then allowing 30 minutes for subsequent growth (development) in the dark at −0.3 V vs. Cu/Cu pyrophosphate. When seeding occurred, this long development time yielded a copper dot that was clearly visible under a microscope. The shortest laser illumination time required to generate a visible copper dot under these conditions was denoted as the seed time for that particular sample.

Table 1 tabulates X-ray diffraction data for commercial sheet nickel (Ni-200) and two different electrodeposited (ED) nickel substrates coated with NiO. The X-ray intensity data, corrected for crystallographic plane intensity differences, are included for the initial nickel substrates, the substrates after sol-gel/thermal processing, and the sol-gel/thermal NiO coatings. The results of copper seed time tests show that seed time is much shorter for the NiO coatings on

TABLE 1

Effect of Substrate Crystallographic Texture on Seed Time for Photoelectrochemical Deposition of Copper on Sol-gel/Thermal Nickel Oxide Coatings The relationship between the initial nickel substrate texture and the NiO coating texture is rather complicated. For example, the largest amount of substrate Ni{110} texture (0.84 compared to 0.29 and 0.01) does not lead to the largest NiO{110} coating texture. Likewise, a highly Ni{100} textured substrate (0.98 compared to 0.64 and 0.08) does not lead to a highly NiO{100} textured coating. This behavior can be understood by noting that the substrate Ni{111} texture was always small (<0.1), but the coating NiO{111} texture was always substantial (0.26 to 0.44), indicating that the NiO sol-gel/thermal process exhibits a natural tendency toward NiO{111} as a preferred orientation. Nevertheless, epitaxial effects operate to limit the apparently detrimental NiO{110} texture by enhancing the NiO{100} and NiO{111} textures. Such weak epitaxial effects are not surprising, however, because the lattice spacing mismatch between Ni and NiO is relatively large.

The tendency toward the NiO{111} orientation was verified by a separate observation that NiO sol-gel/thermal coatings on nickel single crystal substrates (electroetched in phosphoric acid after polishing to remove damaged surface layers) yielded large amounts of the NiO{111} orientation in all cases, i.e., 85, 51 and 26% on Ni{111}, Ni{100} and Ni{110} substrates, respectively. Unfortunately, copper dot seed times measured for NiO coatings on single crystal substrates could not be compared meaningfully because differences in growth rates resulted in oxides of grossly different thicknesses.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

We claim:

1. A method of producing a nickel oxide coating, comprising the steps of:

providing a nickel substrate having crystallites with preferred orientations of Ni{100} and Ni{111}; and forming said oxide coating on said nickel substrate using a sol-gel/thermal process;

said oxide coating tending to acquire crystallographic orientations other than Ni{110} due to the influence of said preferred substrate orientations.

2. The method of claim 1, wherein the step of providing said metallic substrate comprises electrodepositing said metallic substrate with said preferred crystallite orientation.

3. The method of claim 1, wherein the step of providing said metallic substrate comprises vacuum depositing said metallic substrate with said preferred crystallite orientation.

4. A method of producing a nickel oxide coating having a desired crystallographic orientation, comprising the steps of:

providing a nickel substrate having crystallites with preferred orientations of Ni{100} and Ni{111}; and forming said oxide coating on said nickel substrate using a sol-gel/thermal process;

said oxide coating tending to acquire crystallographic orientations other than Ni{110} due to the influence of said preferred substrate orientations.

5. The method of claim 4, wherein the step of providing said metallic substrate comprises electrodepositing said metallic substrate with said preferred crystallite orientation.

6. The method of claim 4, wherein the step of providing said metallic substrate comprises vacuum depositing said metallic substrate with said preferred crystallite orientation.

7. A method of producing a nickel oxide coating having a desired crystallographic orientation, comprising the steps of:

providing a nickel substrate having crystallites with preferred orientations of Ni{100} and Ni{111}; and forming said nickel oxide coating on said nickel substrate using a sol-gel/thermal process;

said nickel oxide coating tending to acquire crystallographic orientations other than Ni{110} due to the influence of said preferred substrate orientations.

* * * * *